(12) United States Patent
Odaka

(10) Patent No.: US 10,707,194 B2
(45) Date of Patent: Jul. 7, 2020

(54) DISPLAY DEVICE INCLUDING SUPPORT FILMS

(71) Applicant: Japan Display Inc., Tokyo (JP)

(72) Inventor: Kazuhiro Odaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 53 days.

(21) Appl. No.: 15/718,793

(22) Filed: Sep. 28, 2017

(65) Prior Publication Data
US 2018/0108640 A1    Apr. 19, 2018

(30) Foreign Application Priority Data
Oct. 17, 2016 (JP) ................. 2016-203322

(51) Int. Cl.
| | |
|---|---|
| H01L 25/16 | (2006.01) |
| H01L 51/52 | (2006.01) |
| H01L 23/00 | (2006.01) |
| H01L 51/00 | (2006.01) |

(52) U.S. Cl.
CPC ............ *H01L 25/167* (2013.01); *H01L 24/83* (2013.01); *H01L 51/0097* (2013.01); *H01L 51/524* (2013.01); *H01L 51/529* (2013.01); *H01L 51/5237* (2013.01); *H01L 24/29* (2013.01); *H01L 24/32* (2013.01); *H01L 2224/32225* (2013.01); *H01L 2224/8321* (2013.01); *H01L 2224/83203* (2013.01); *H01L 2224/83815* (2013.01); *H01L 2924/14* (2013.01); *H01L 2924/19041* (2013.01); *H01L 2924/19043* (2013.01); *H01L 2924/19105* (2013.01); *Y02E 10/549* (2013.01)

(58) Field of Classification Search
CPC .......... H01L 23/00; H01L 51/00; H01L 51/52
USPC ....................... 257/774, 88; 438/28
See application file for complete search history.

(56) References Cited

U.S. PATENT DOCUMENTS

| | | | |
|---|---|---|---|
| 2012/0187399 A1* | 7/2012 | Fukuda ............. | H01L 29/78603 257/43 |
| 2013/0293816 A1* | 11/2013 | Jung ................. | H01L 23/49827 349/139 |
| 2015/0036300 A1* | 2/2015 | Park ...................... | H05K 1/147 361/749 |

(Continued)

FOREIGN PATENT DOCUMENTS

JP        2008-197757 A    8/2008

*Primary Examiner* — Sheng-Bai Zhu

(74) *Attorney, Agent, or Firm* — Michael Best & Friedrich LLP

(57) ABSTRACT

A display device includes a substrate having flexibility, a first surface and a second surface opposing the first surface, a display part arranged with a plurality of pixels above the first surface of the substrate, a frame part having a drive element for driving the plurality of pixels arranged around the display part, a mounting part mounted above the first surface of the substrate and including an individual circuit element and a connection element, a first adhesive layer above the second surface of the substrate and opposing the display part and the frame part, a first support film above the first adhesive layer, a second adhesive layer above the second surface of the substrate and opposing the mounting part, and a second support film above the second adhesive layer, wherein the first adhesive layer and the first support film separated from the second adhesive layer and the second support film.

9 Claims, 16 Drawing Sheets

(56) References Cited

U.S. PATENT DOCUMENTS

| | | | |
|---|---|---|---|
| 2015/0187845 A1* | 7/2015 | Kim | H01L 27/323 257/40 |
| 2015/0187849 A1* | 7/2015 | Kachatryan | H01L 51/56 257/40 |
| 2015/0212548 A1* | 7/2015 | Namkung | G06F 1/1652 345/174 |
| 2015/0253613 A1* | 9/2015 | Yoon | G02F 1/13452 349/58 |
| 2017/0108721 A1* | 4/2017 | Bae | G02B 6/0083 |

* cited by examiner

DISPLAY DEVICE INCLUDING SUPPORT FILMS

CROSS REFERENCE TO RELATED APPLICATIONS

This application is based upon and claims the benefit of priority from the prior Japanese Patent Application No. 2016-203322, filed on Oct. 17, 2016, the entire contents of which are incorporated herein by reference.

FIELD

The present invention is related to a mounting technology to a thin type display device.

BACKGROUND

Liquid crystal display devices which utilize the electro-optical effects of liquid crystals and organic EL display devices which use an organic electroluminescence element are being developed and practically utilized as display devices for use in electrical appliances and electronic devices.

In particular, when an organic EL element is used as a display element, the display device has a high viewing angle and can display with high definition. In addition, the display device can be manufactured on a flexible substrate. A display device which can bend a flexible substrate between a display part and a periphery circuit part for driving a display element is disclosed in Japanese Laid Open Patent Application Publication No. 2008-197757. Therefore, it is possible to provide a small scale display device as a whole while enlarging the display part.

SUMMARY

A display device in an embodiment according to the present invention includes a substrate having flexibility, and a first surface and a second surface opposing the first surface, a display part arranged with a plurality of pixels arranged above the first surface of the substrate, a frame part having a drive element for driving the plurality of pixels arranged around the display part, a mounting part arranged mounted above the first surface of the substrate and including an individual circuit element and a connection element, a first adhesive layer arranged above the second surface of the substrate and arranged opposing the display part and the frame part, a first support film above the first adhesive layer, a second adhesive layer arranged above the second surface of the substrate and arranged opposing the mounting part, and a second support film above the second adhesive layer. The first adhesive layer and the first support film separated from the second adhesive layer and the second support film.

DESCRIPTION OF EMBODIMENTS

Hereinafter, embodiments according to the present invention will be described with reference to the drawings. This disclosure merely provides an example, and modifications or alterations thereof readily conceivable by a person of ordinary skill in the art without departing from the gist of the present invention are duly encompassed in the scope of the present invention. The drawings are merely examples and do not limit the interpretations of the present invention in any way.

In the specification and the drawings, components that have substantially the same functions as those described before with reference to a previous drawing(s) bear the identical reference signs thereto, and detailed descriptions thereof may be omitted. The words "first", "second" or the like provided for components are used merely to distinguish the components from each other, and do not have any further meaning unless otherwise specified.

In the present specification, in the case where certain parts or regions are given as [above (or below)] other parts or regions, as long as there is no particular limitation, these include parts which are not only directly above (or directly below) other parts or regions but also in an upper direction (or lower direction). That is, in the case where certain parts or regions are given as [above (or below)] other parts or regions, other structural elements may be included between other parts or regions in an upper direction (or lower direction). Furthermore, in the explanation below, as long as there is no particular limitation, a side which is arranged with a display element with respect to a substrate in a cross-sectional view is referred to as [upper] or [top surface] and the reverse is referred to as [lower] or [rear surface].

In the case of manufacturing a display device using a thin substrate such as a sheet display, if no support base material (a glass substrate for example) is present under the display device, it is difficult to mount a flexible printed substrate having a circuit element (driver IC for example) in the display device. In addition, since the number of signals from a drive element increases due to an increase in the number of pixels, high precision mounting technology is necessary and therefore there is concern that there may be a drop in mounting yield.

An embodiment of the present invention discloses a display device below in which a circuit element for driving a display element is internally integrated.

First Embodiment (1-1. Structure of Display Device)

Figure 1:
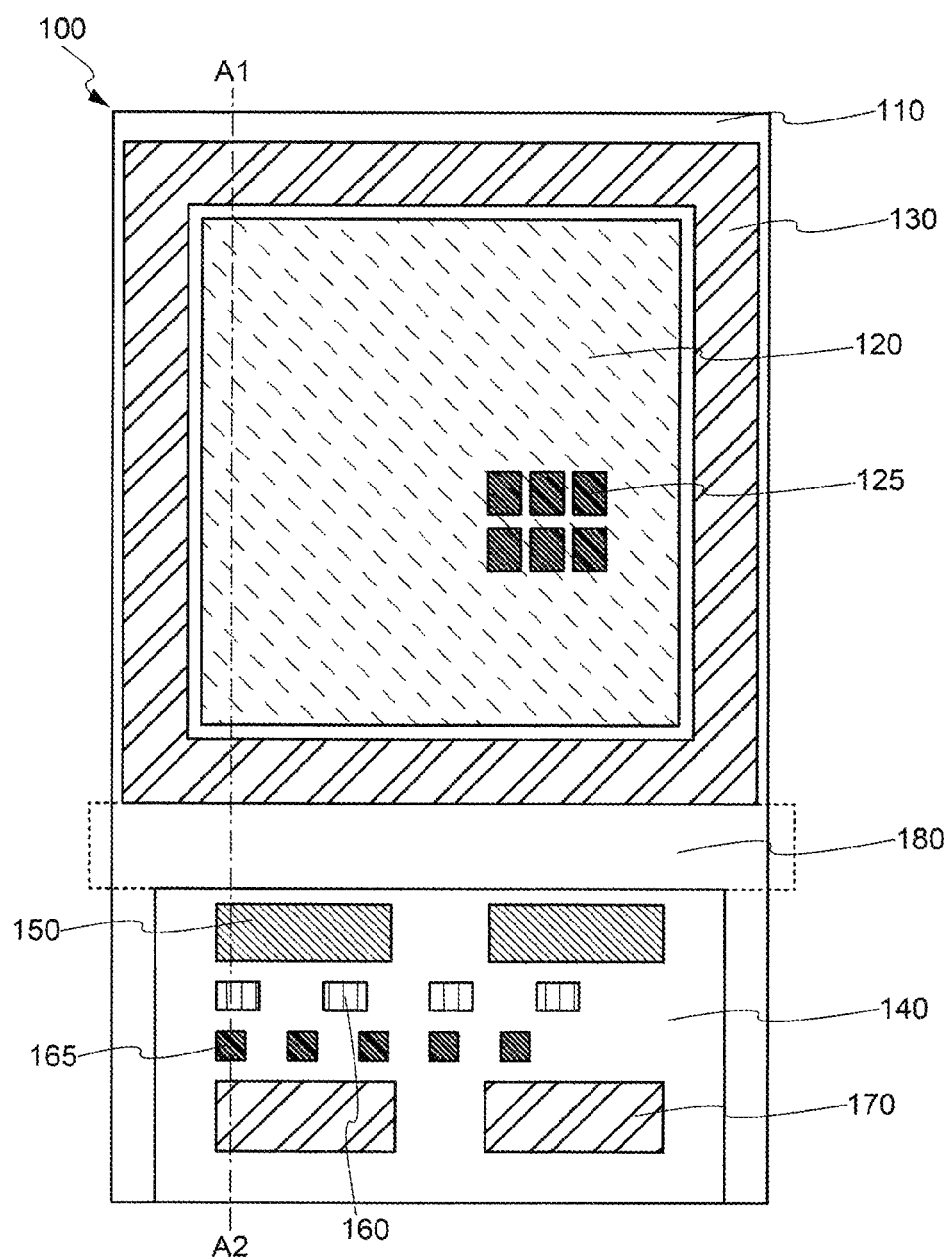
FIG. 1 is a top surface view diagram of a display device related to one embodiment of the present invention.
Figure 2:
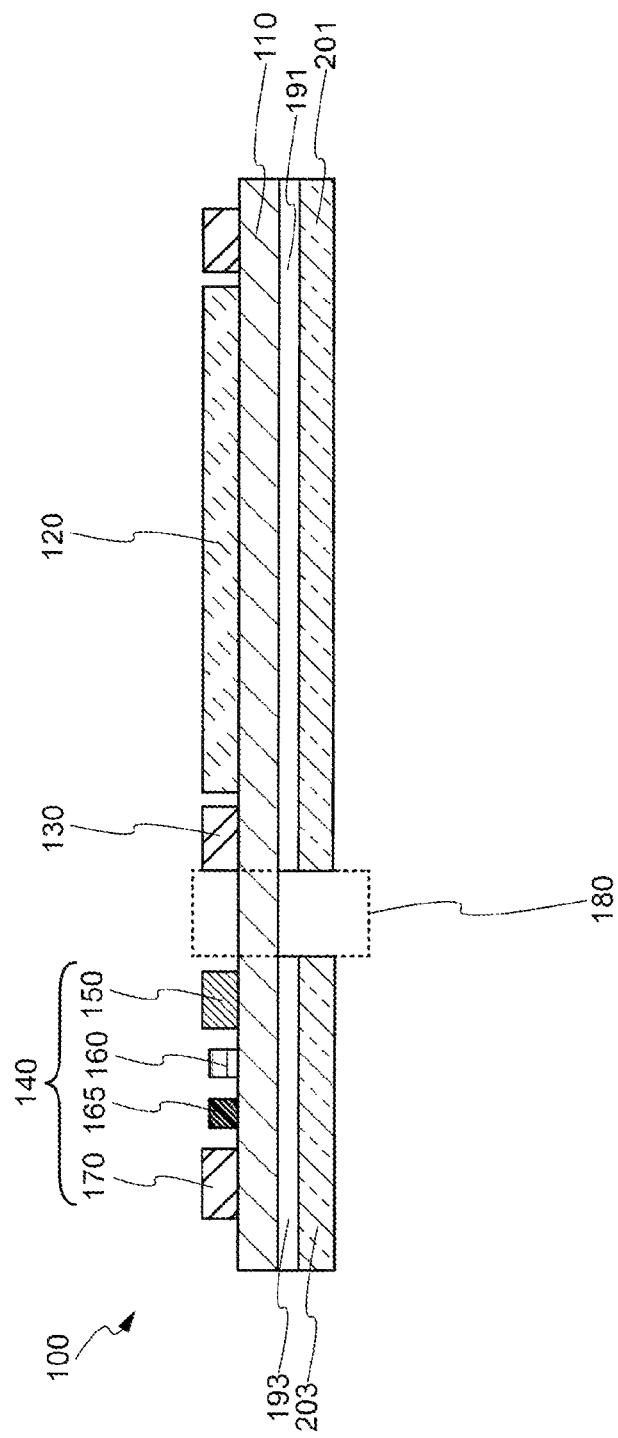
FIG. 2 is a cross-sectional diagram of a display device related to one embodiment of the present invention.

A top surface view of a display device 100 is shown in FIG. 1, and a cross-section between A1-A2 of the top surface view of the display device 100 is shown in FIG. 2. As is shown in FIG. 1 and FIG. 2, the display device 100 includes a substrate 110, a display part 120, a frame part 130, individual circuit elements such as a discrete integrated circuit 150, a resistance element 160, a capacitor element 165, a mounting part 140 including a connection terminal 170, a bent part 180, an adhesive layer 191, an adhesive layer 181, a support film 201 and a support film 203.

The substrate 110 includes a first surface and a second surface opposing the first surface. In addition, the substrate 110 has flexibility. The substrate 110 can be bent at the bent part 180 arranged between the frame part 130 and the mounting part 140. Furthermore, wiring is arranged in the bent part 180, and the frame part 130 and the mounting part 140 are electrically connected by the wiring.

A plurality of pixels 125 are arranged in an array shape in the display part 120. In the case of an active matrix type, a thin film transistor and a display element are arranged in each pixel.

The frame part 130 is arranged on the periphery of the display part 120. The frame part 130 includes a drive element which drives a pixel. The drive element described above is formed by a transistor and the like. A flip-flop, a clocked invertor or buffer are used as the drive element described above and includes a part or all of the functions of a drive circuit (gate driver or source driver).

The mounting part 140 is arranged above the substrate 110 on the outer side of the frame part 130. Individual circuit elements including a discrete integrated circuit 150, resistor element 160, capacitive element 165 and the like and the connection terminal 170 are mounted in the mounting part 140. The discrete integrated circuit 150 includes a central processing unit (CPU), a storage element (memory) and the like and functions as a microcomputer. The functions of the CPU and the memory can be arranged together or separately in the discrete integrated circuit 150. In addition, the discrete integrated circuit 150 is used in combination with the resistor element 160 and the capacitor element 165 as appropriate. A signal is transmitted from the discrete integrated circuit 150 to a drive element arranged in the frame part 130. The connection terminal 170 is arranged for connecting to an external power supply.

A thin film transistor arranged in the display part 120 drives a display element based on a signal sent from the discrete integrated circuit 150 and a drive element of the frame part 130 and the like. In this way, a still image or video is displayed in the display part 120. For example, an organic EL element is used for the display element.

The adhesive layer 191 and the adhesive layer 193 are arranged on the second surface of the substrate 110. The adhesive layer 191 is arranged facing the display part 120 and the frame part 130. The adhesive layer 193 is arranged on the second surface of the substrate 110 and is arranged facing the mounting part 140. An organic resin such as acrylic resin is used for the adhesive layer 191 and the adhesive layer 193. The adhesive layer 191 and the adhesive layer 193 may have thermosetting properties or photocurable properties.

The support film 201 is arranged on the adhesive layer 191. The support film 203 is arranged on the adhesive layer 193. The adhesive layer 191 and the support film 201, the adhesive layer 193 and the support film 203 are arranged so as to be separated from each other via the bent part 180.

Furthermore, a material having a high thermal conductivity compared to that of the support film 201 is used for the support film 203. For example, a thin plate of copper (Cu), iron (Fe), aluminum (Al), stainless steel or the like is used as the material having high thermal conductivity for the support film 203. An organic resin such as polyethylene terephthalate (PET), acrylic, epoxy, or the like is used as a material having low thermal conductivity for the support film 201. It can also be said that the support film 201 has high heat insulation effects.

By providing the structure described above, the display device 100 can be supplied with power from the exterior and the minimum required signal, and there is no need to mount a flexible printed circuit board.

(1-2. Manufacturing Method of Display Device)

A manufacturing method of the display device 100 is explained below using FIG. 3 to FIG. 9.

Figure 3:
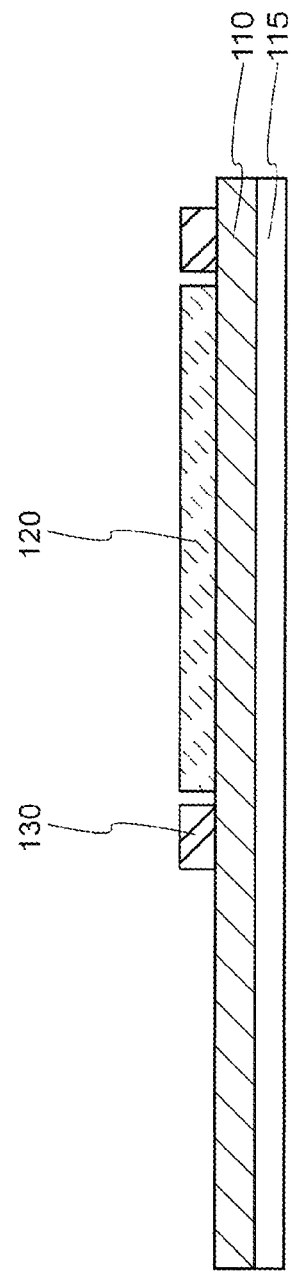
FIG. 3 is a cross-sectional diagram showing a manufacturing method of a display device related to one embodiment of the present invention.

First, as is shown in FIG. 3, the display part 120 and the frame part 130 which is formed on the periphery of the display part 120 are formed above a first surface (upper surface) of the substrate 110.

The substrate 110 is a substrate having flexibility. An organic resin such as polyimide, acrylic, epoxy or the like is used for the substrate 110. In addition, on the lower side of the substrate 110, a support substrate 115 is arranged on a second surface (lower surface) of the substrate 110. In this way, it is easier to fix the substrate 110 and form the display part 120 and the frame part 130. A substrate having rigidity is used for the supporting substrate 115. For example, a glass substrate is used as the supporting substrate 115.

Transistors, display elements and sealing layers and the like which form a plurality of pixels are formed in the display part 120. Drive elements for driving a pixel are formed in the frame part 130. Flip-flops, clocked inverters, buffers and the like formed by transistors and capacitive elements and the like are formed as drive elements.

Figure 4:
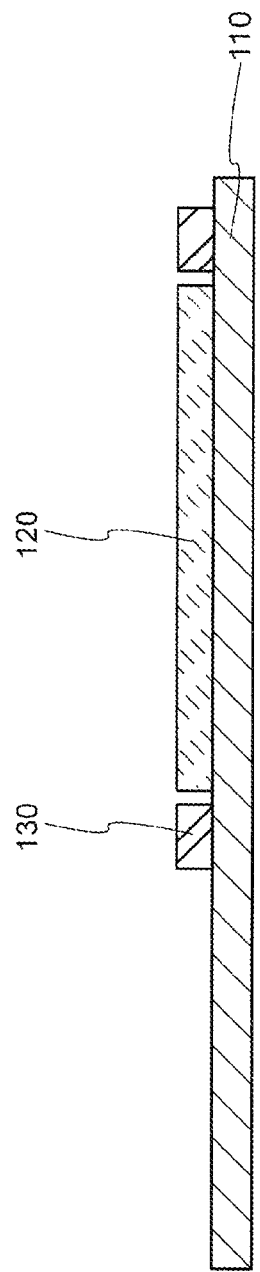
FIG. 4 is a cross-sectional diagram showing a manufacturing method of a display device related to one embodiment of the present invention.

Next, as is shown in FIG. 4, the support base material 115 is peeled from the substrate 110. A laser irradiation method is used as a peeling method of the support base material. An excimer laser, neodymium YAG (Nd: YAG) laser or the like is used for the laser. Light in the ultraviolet region is mainly irradiated in the case where an excimer laser is used. For example, light with a wavelength of 308 nm is irradiated with an excimer laser using xenon chloride.

Figure 5:
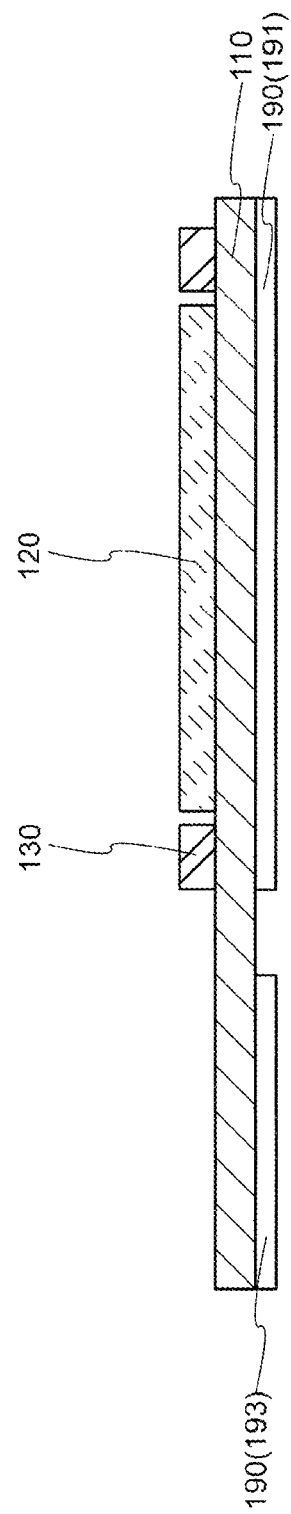
FIG. 5 is a cross-sectional diagram showing a manufacturing method of a display device related to one embodiment of the present invention.

Next, as is shown in FIG. 5, an adhesive layer 190 including the adhesive layer 191 and the adhesive layer 193 is formed on the second surface (lower surface) of the substrate 110. An organic resin such as acrylic, epoxy, silicone or the like is used for the adhesive layer 190. The adhesive layer 190 is formed by a printing method or a coating method or the like.

Figure 6:
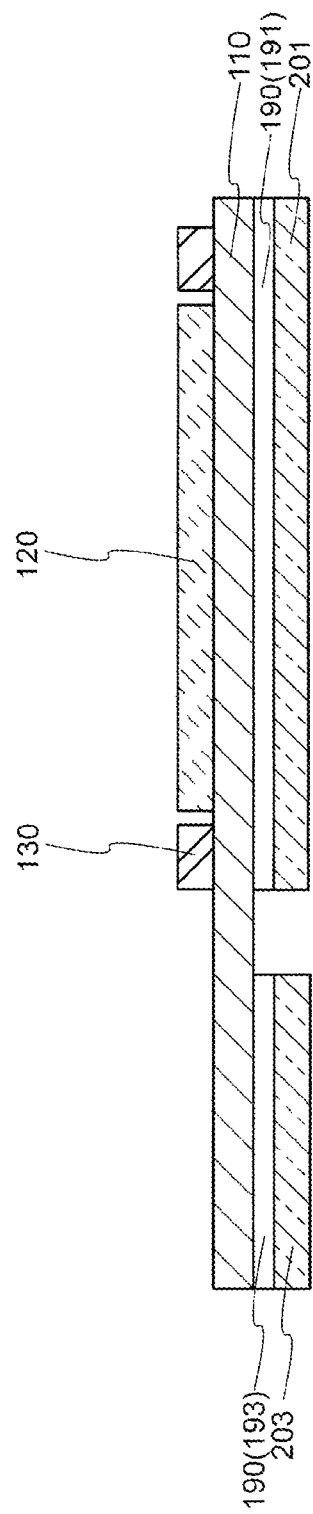
FIG. 6 is a cross-sectional diagram showing a manufacturing method of a display device related to one embodiment of the present invention.

Next, as is shown in FIG. 6, the support film 201 is formed on the adhesive layer 190 (adhesive layer 191) so as to face the display part 120 and the frame part 130. In addition, the support film 203 is formed on the adhesive layer 190 (adhesive layer 193) so as to be separated from the support film 201. Furthermore, a material having a high thermal conductivity compared with that of the support film 201 is used for the support film 203. An organic resin is used as a material having a low thermal conductivity for the support film 201. For example, an organic resin such as polyethylene terephthalate (PET), acrylic or epoxy is used for the support film 201. In addition, a heat dissipation member may be arranged under the support film 201. A metal material is used as a material having a high thermal conductivity for the support film 203. For example, a thin plate of copper (Cu), iron (Fe), aluminum (Al), stainless steel or the like is used as the support film 203.

Figure 7:
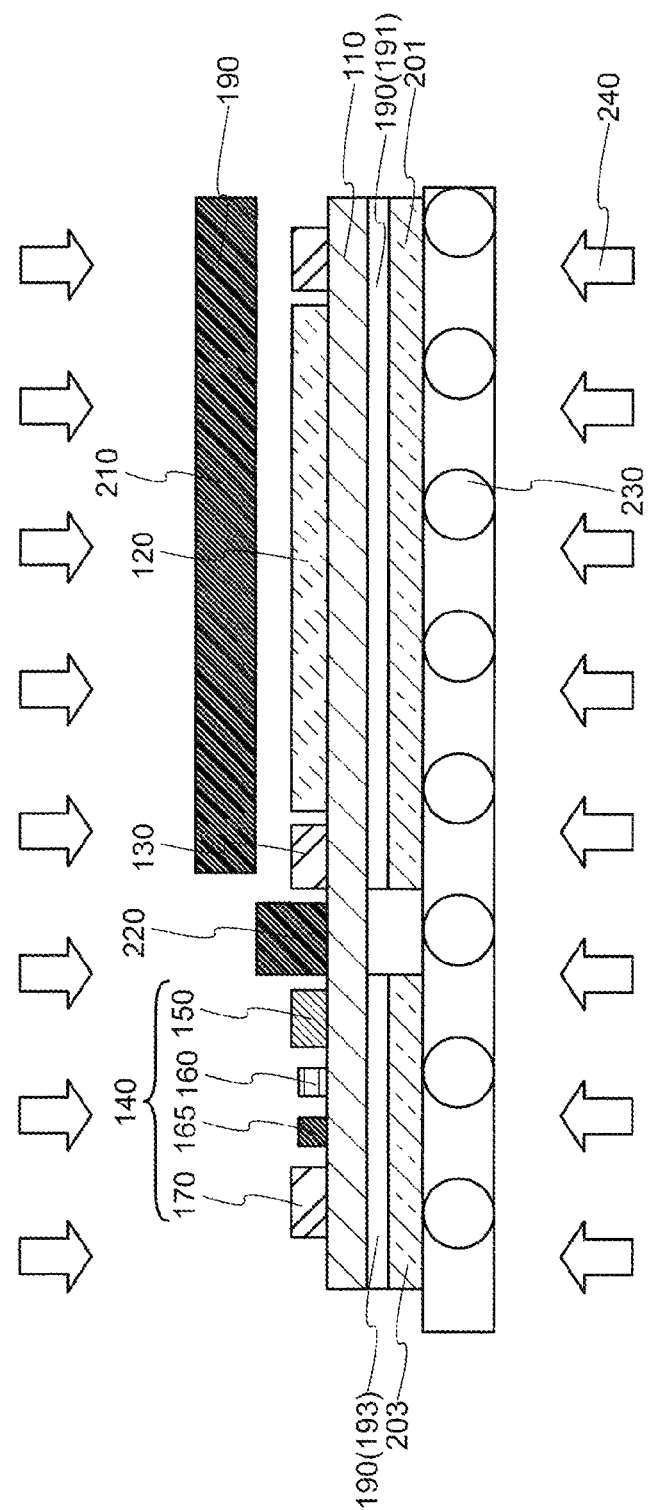
FIG. 7 is a cross-sectional diagram showing a manufacturing method of a display device related to one embodiment of the present invention.
Figure 8:
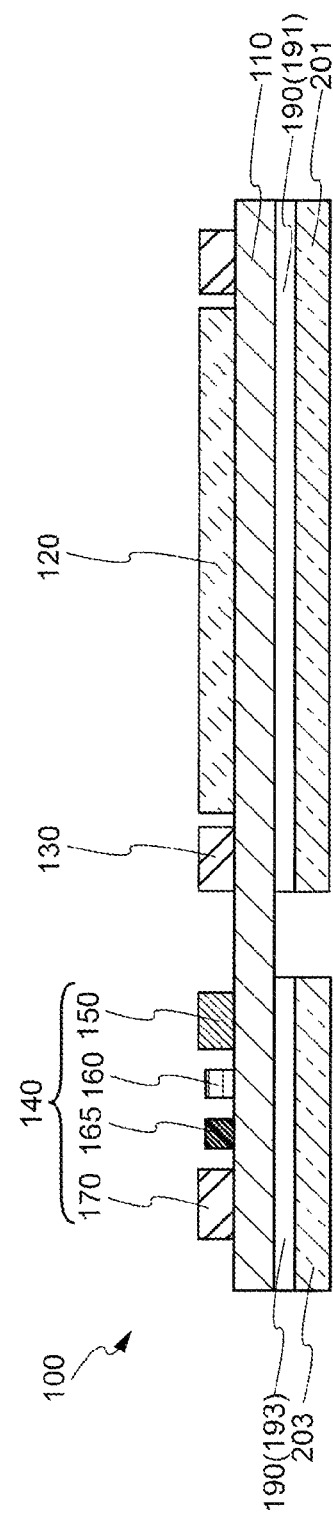
FIG. 8 is a cross-sectional diagram showing a manufacturing method of a display device related to one embodiment of the present invention.

Next, as is shown in FIG. 7, the mounting part 140 is formed by mounting the individual circuit elements and the connection terminal 170 so as to face the support film 203. The discrete integrated circuit 150, a resistor element 160 and capacitor element 165 and the like are formed as the individual circuit elements. The individual circuit elements and the connection terminal 170 may be adhered by soldering or bonded by thermocompression. The solder may include gold, silver, copper, antimony, silicon, germanium, indium, etc. in addition to tin and lead. An eutectic solder, a high melting point solder, a low melting point solder, a cream solder is used for the solder.

For example, in the case when the individual circuit elements and connection terminal 170 are mounted using a cream solder, the following method is used. First, the substrate 110 is transferred to above a roller belt 230, and a cream solder is formed by a printing method in a region corresponding to the mounting part 140 of the substrate 110. Next, the individual circuit elements and the connection terminal 170 are placed on the cream solder at predetermined positions. Next, heat is applied to the substrate 110 from the vertical direction of the substrate 110 in a reflow furnace. In this way, the cream solder melts and the discrete integrated circuit 150, the resistor element 160, the capacitor element 165 and the connection terminal 170 are mounted on the substrate 110. Furthermore, in the reflow furnace, since heat from 220 to 260 degrees is applied to the substrate 110, the display part 120 and the frame part 130 are heat shielded by a heat shielding member including a heat shielding mask 210 and heat sink 220. In addition, as described above, the support film 203 which faces the mounting part 140 has high thermal conductivity on the second surface (lower surface) side of the substrate 110, and the support film 201 which faces the display part 120 and the frame portion 130 has low thermal conductivity. Therefore, heat is applied to the mounting part 140 from the vertical direction of the substrate 110 and the individual circuit elements and the connection terminal 170 are securely mounted. In addition, the display part 120 and the frame part 130 can prevent an organic EL element from deteriorating due to heat even when the organic EL element is used for the display part 120, since the vertical direction of the substrate 110 is heat shielded. Furthermore, A heat dissipation member may also be arranged between the support film 201 and the roller belt 230.

Figure 9:
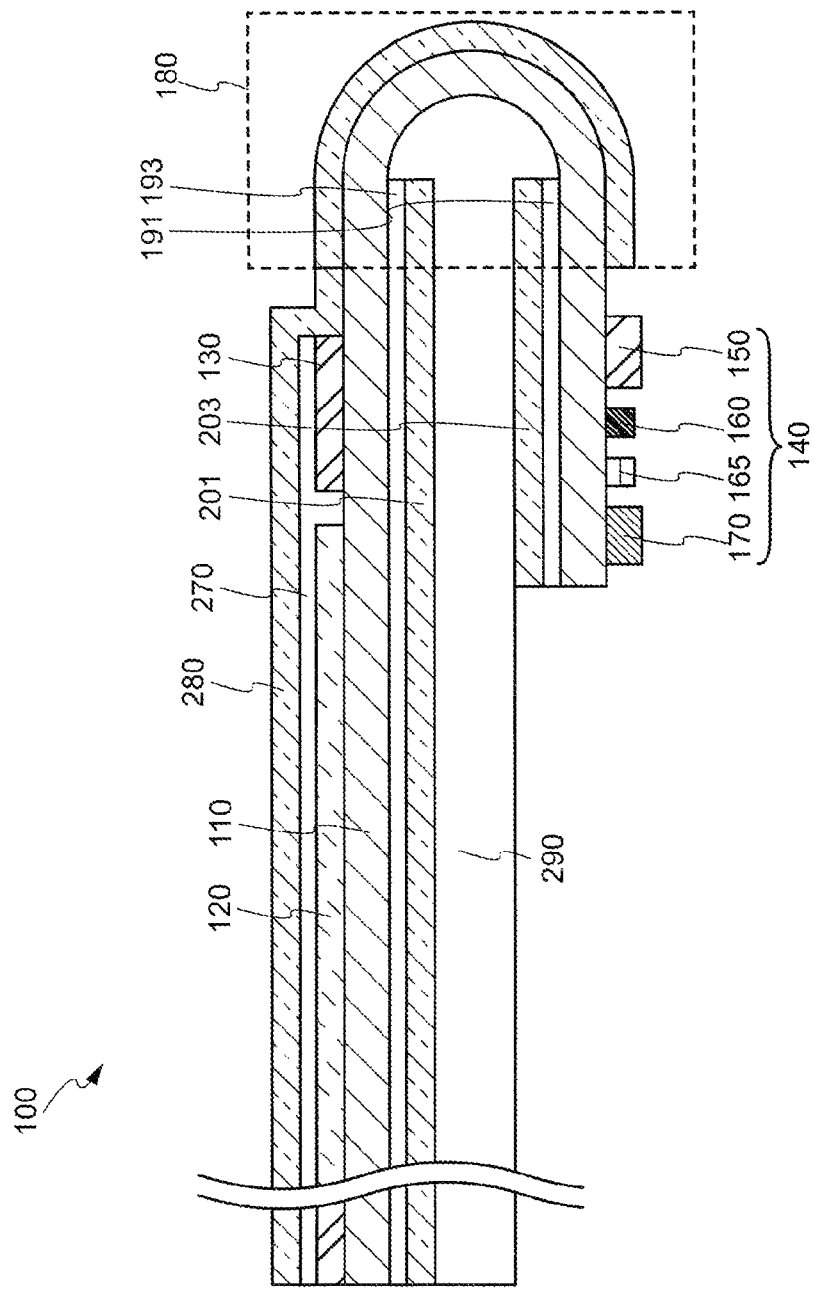
FIG. 9 is a cross-sectional diagram showing a manufacturing method of a display device related to one embodiment of the present invention.

As described above, as is shown in FIG. 8, it is possible to manufacture the display device 110 in which a circuit element for driving a display element is internally installed without using a flexible printed substrate. By using the manufacturing method described above, it is possible to mount a circuit element without using high precision mounting technology. Therefore, the mounting yield of the display device can be increased. As is shown in FIG. 9, the display device 100 can be bent via the bent part 180. In addition to the components described above, the display device 100 may also be arranged with an adhesive layer 270, a protective film 280 and a spacer 290.

Figure 10:
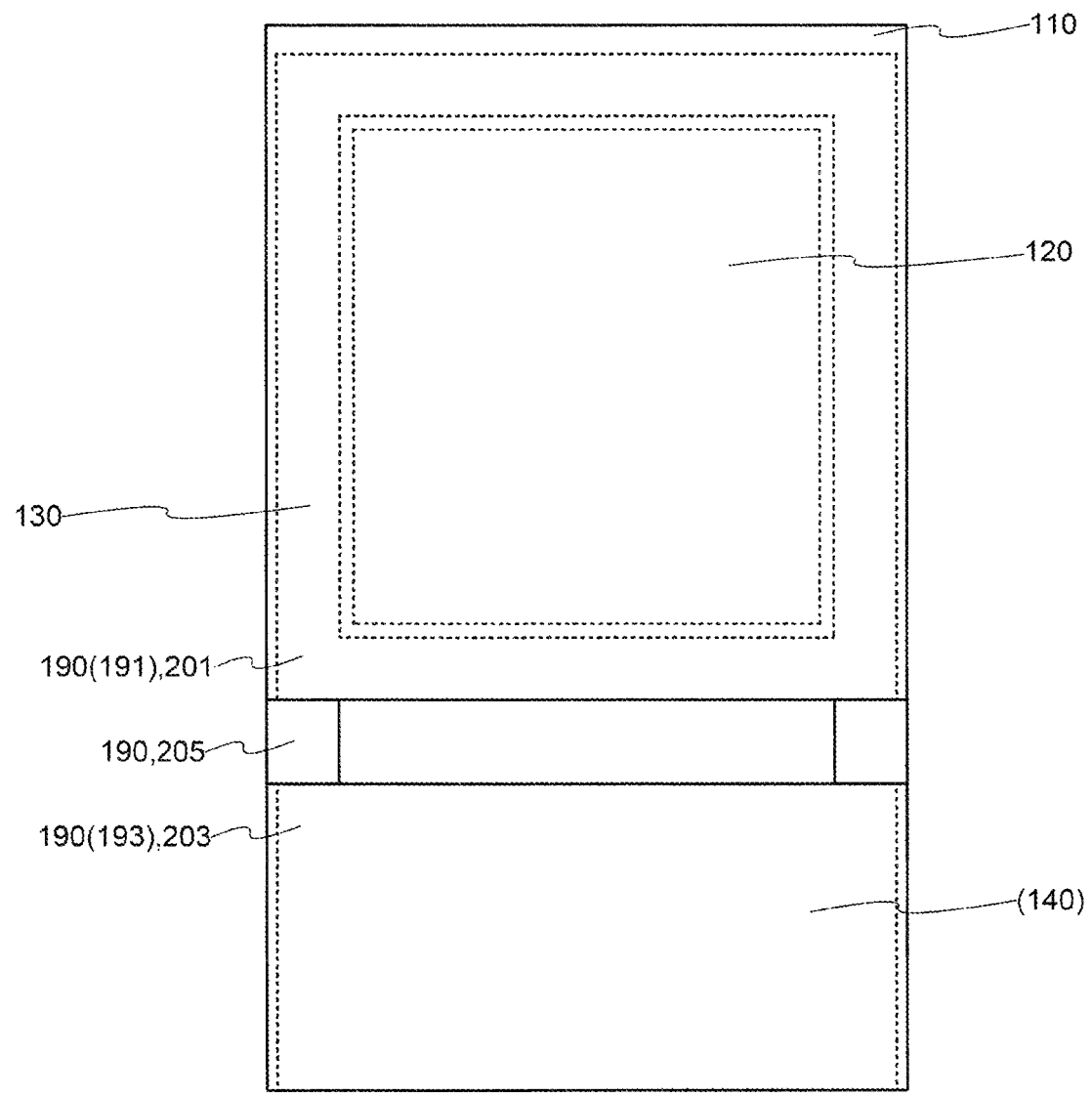
FIG. 10 is a top surface view diagram showing a manufacturing method of a display device related to one embodiment of the present invention.

As is shown in FIG. 10, a support film 205 may be formed on the adhesive layer 190 so that the support film 201 and the support film 203 are connected at both ends thereof. The support film 205 may be formed using the same material as the material of the support film 201.

In addition, the support film 201 and the support film 205 may be formed simultaneously. The support film 205 and the adhesive layer 190 under the support film 205 may be removed after forming the mounting part 140.

Second Embodiment (2-1. Structure of Display Device)

A display device having a different adhesive layer structure to that of the first embodiment is explained below. Furthermore, the materials, structure and methods used in the first embodiment can also be employed in the present embodiment.

Figure 11:
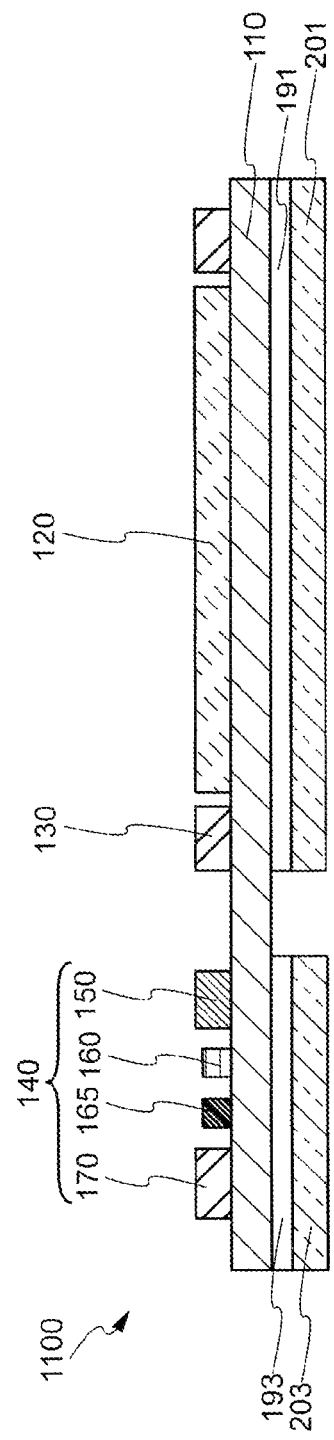
FIG. 11 is a cross-sectional diagram of a display device related to one embodiment of the present invention.

A cross-sectional view of a display device 1100 is shown in FIG. 11. As is shown in FIG. 11, the display device 1100 includes a substrate 110, a display part 120, a frame part 130, individual circuit elements including a discrete integrated circuit 150, a resistor element 160, a capacitor element 165, a mounting part 140 including a connection terminal 170, an adhesive layer 191, an adhesive layer 193, a support film 201 and a support film 203.

The adhesive layer 193 has a higher thermal conductivity compared with that of the adhesive layer 191. The adhesive layer 193 may include an organic resin such as acrylic or epoxy and a filler formed from an inorganic material having a high thermal conductivity. For example, a ceramic such as silica is used as the filler. On the other hand, an organic resin such as polyethylene terephthalate (PET), acrylic, epoxy and silicone and the like having a low thermal conductivity is used for the adhesive layer 191.

The same material is used for the support film 201 and the support film 203. An organic resin is used for the support film 201 and the support film 203. An organic resin such as acrylic, epoxy, silicone or the like is used for the support film 201 and the support film 203. Furthermore, a heat dissipation material may be arranged between the support film 201 and the adhesive layer 191.

(2-2. Manufacturing Method of Display Device)

A manufacturing method of the display device 1100 is explained below.

First, the display part 120 and the frame part 130 are formed on the first surface of the substrate 110 having the second surface on which the support base material 115 is arranged. Next, the support base material 115 is peeled from the substrate 110.

Figure 12:
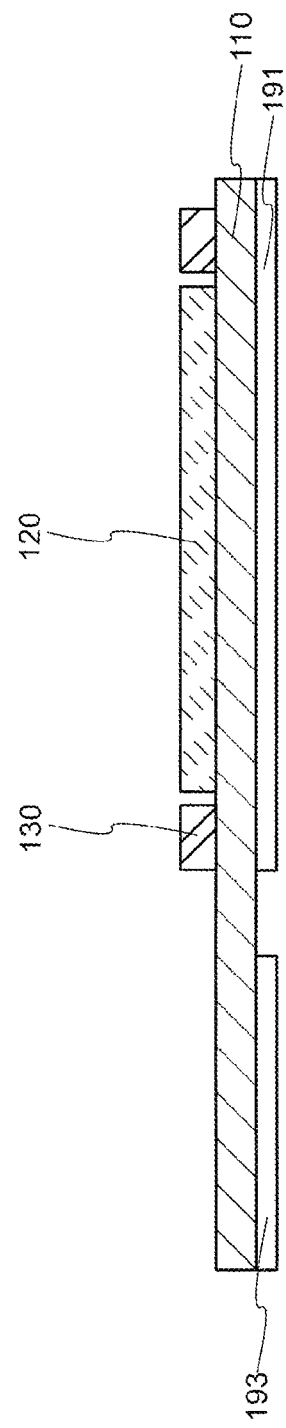
FIG. 12 is a cross-sectional diagram showing a manufacturing method of a display device related to one embodiment of the present invention.

Next, as is shown in FIG. 12, the adhesive layer 191 is formed on the second surface of the substrate 110 so as to face the display part 120 and the frame part 130. The adhesive layer 191 is printed by a printing method or a coating method. A material having a low thermal conductivity is used as the adhesive layer 191. For example, an organic resin such as adhesive layer polyethylene terephthalate (PET), acrylic, epoxy or the like is used. The adhesive layer 191 may have thermosetting, photo-curable, or pressure-sensitive properties. In the case when a thermosetting material is used for the adhesive layer 191, a material which cures at a low temperature (for example, room temperature to 50° C.) may be used. In addition, a heat dissipation material may be formed between the adhesive layer 191 and the support film 201.

Next, the adhesive layer 193 is formed on the second surface of the substrate 110 so as to be separated from the adhesive layer 191. The adhesive layer 193 is formed using the same method as the adhesive layer 191. A material having a higher thermal conductivity compared to the adhesive layer 191 is used as the adhesive layer 193. The adhesive layer 193 may include an organic resin such as acrylic or epoxy and a filler formed from an inorganic material. For example, a ceramic such as silica is used as the filler.

Figure 13:
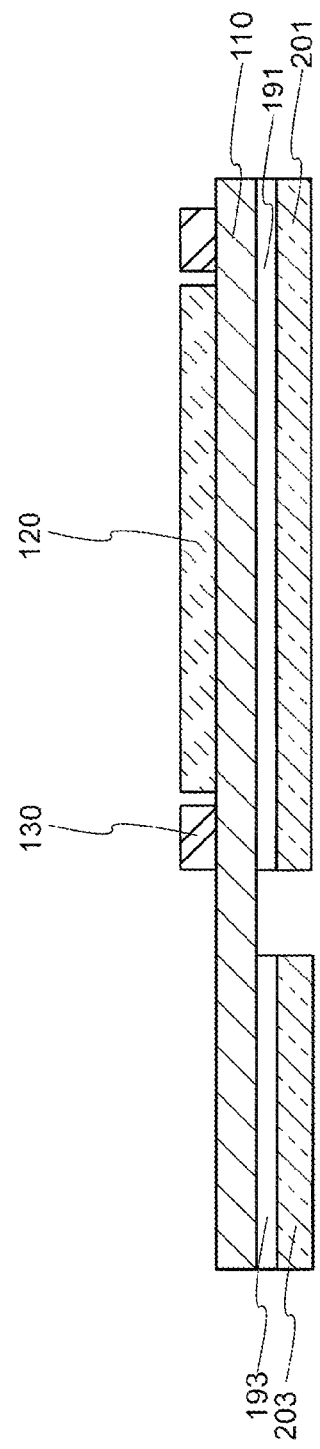
FIG. 13 is a cross-sectional diagram showing a manufacturing method of a display device related to one embodiment of the present invention.

Next, as is shown in FIG. 13, the support film 201 is formed on the adhesive layer 191 so as to face the display part 120 and the frame part 130. In addition, the support film 203 is formed on the adhesive layer 193 so as to be separated from the support film 201. The support film 201 and the support film 203 can be formed from the same material. An organic resin such as acrylic, epoxy, and silicone are used as the support film 201 and the support film 203.

Figure 14:
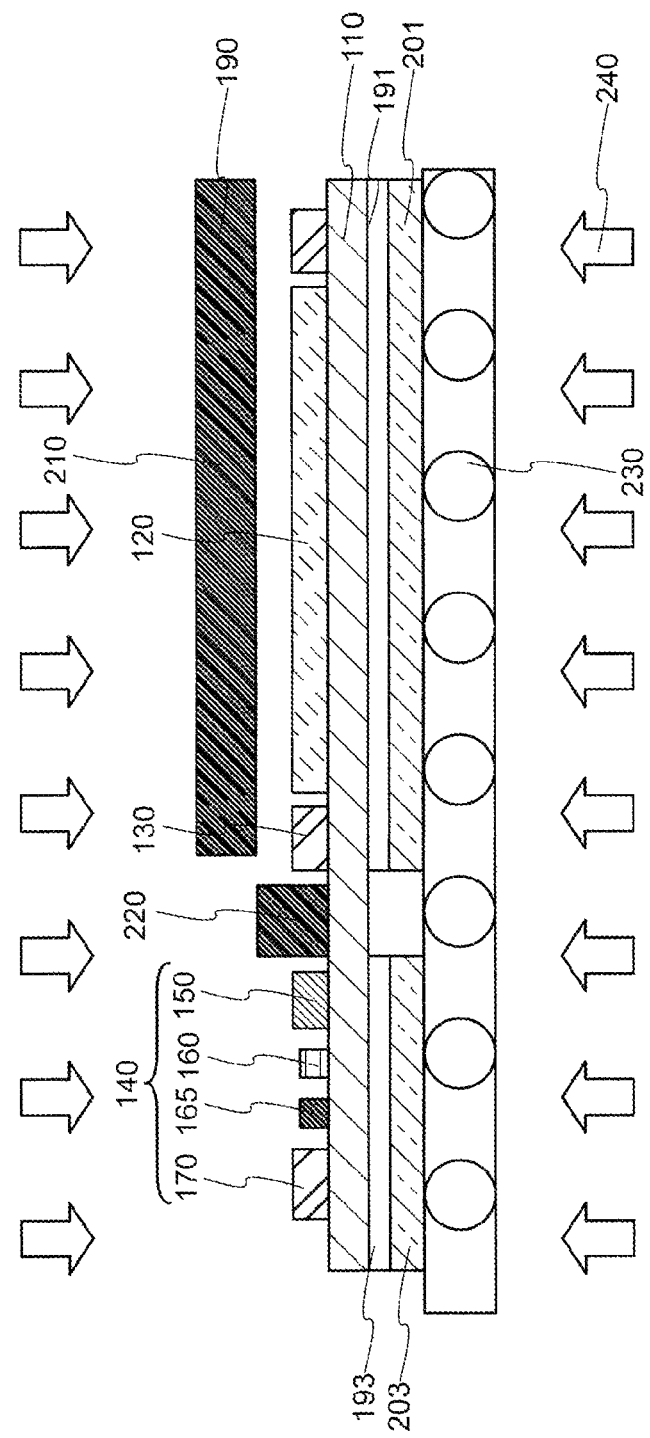
FIG. 14 is a cross-sectional diagram showing a manufacturing method of a display device related to one embodiment of the present invention.

Next, as is shown in FIG. 14, the individual circuit elements including the discrete integrated circuit 150, the resistor element 160, the capacitor element 165 and the like and the connection terminal 170 are mounted on the first surface of the substrate 110 so that the second adhesive layer 193 and the support film 203 are facing each other in a state where the display part 120 and the frame part 130 are heat shielded by the heat shield member including a heat shield mask 210 and heat sink 220.

Furthermore, as described above, in the second surface (lower surface) side of the substrate 110, the adhesive layer 193 which faces the mounting part 140 has a high thermal conductivity and the adhesive layer 191 which faces the display part 120 and the frame part 130 has low thermal conductivity. Therefore, heat is applied to the mounting part 140 from the vertical direction of the substrate 110, and the individual circuit elements and the connection terminal 170 are securely mounted. In addition, the display part 120 and the frame part 130 prevent an organic EL element from deteriorating due to heat even when the organic EL element is used for the display part 120, since the vertical direction of the substrate 110 is heat shielded.

Figure 15:
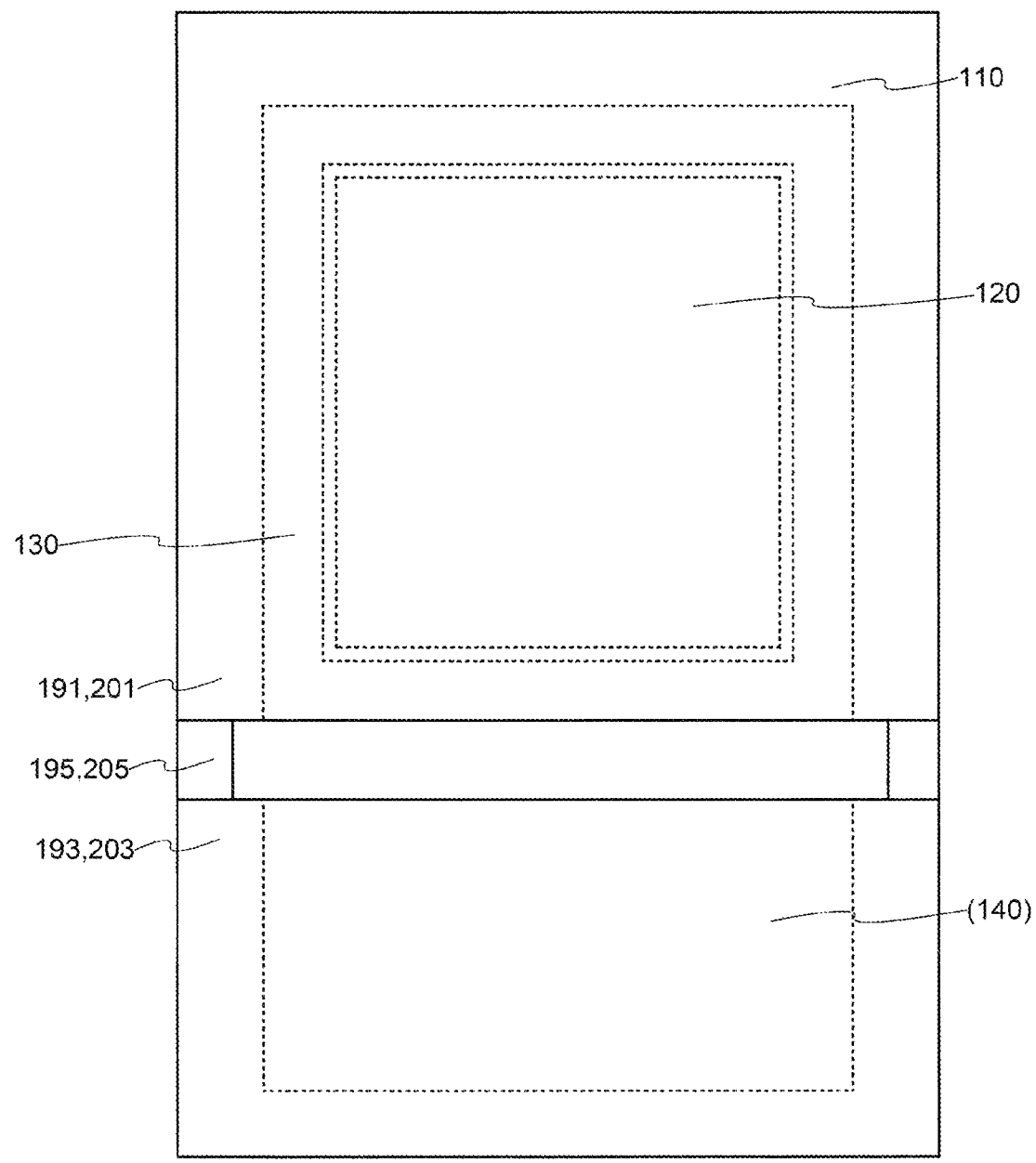
FIG. 15 is a top surface view diagram showing a manufacturing method of a display device related to one embodiment of the present invention.

In addition, as is shown in FIG. 15, an adhesive layer 195 may be formed above the second surface of the substrate 110 before forming the support film 201 and the support film 203 so that the adhesive layer 191 and the adhesive layer 193 are connected at both ends thereof. The adhesive layer 195 may be formed using the same material as the adhesive layer 191. A support film 205 is formed on the adhesive layer 195. The same material as that of the support film 201 and the support film 203 is used for the support film 205. Therefore, the support film 201, the support film 203 and the support film 205 may be formed as an integral type unit. The adhesive layer 195 and the support film 205 may be removed after forming the mounting part 140.

Figure 16:
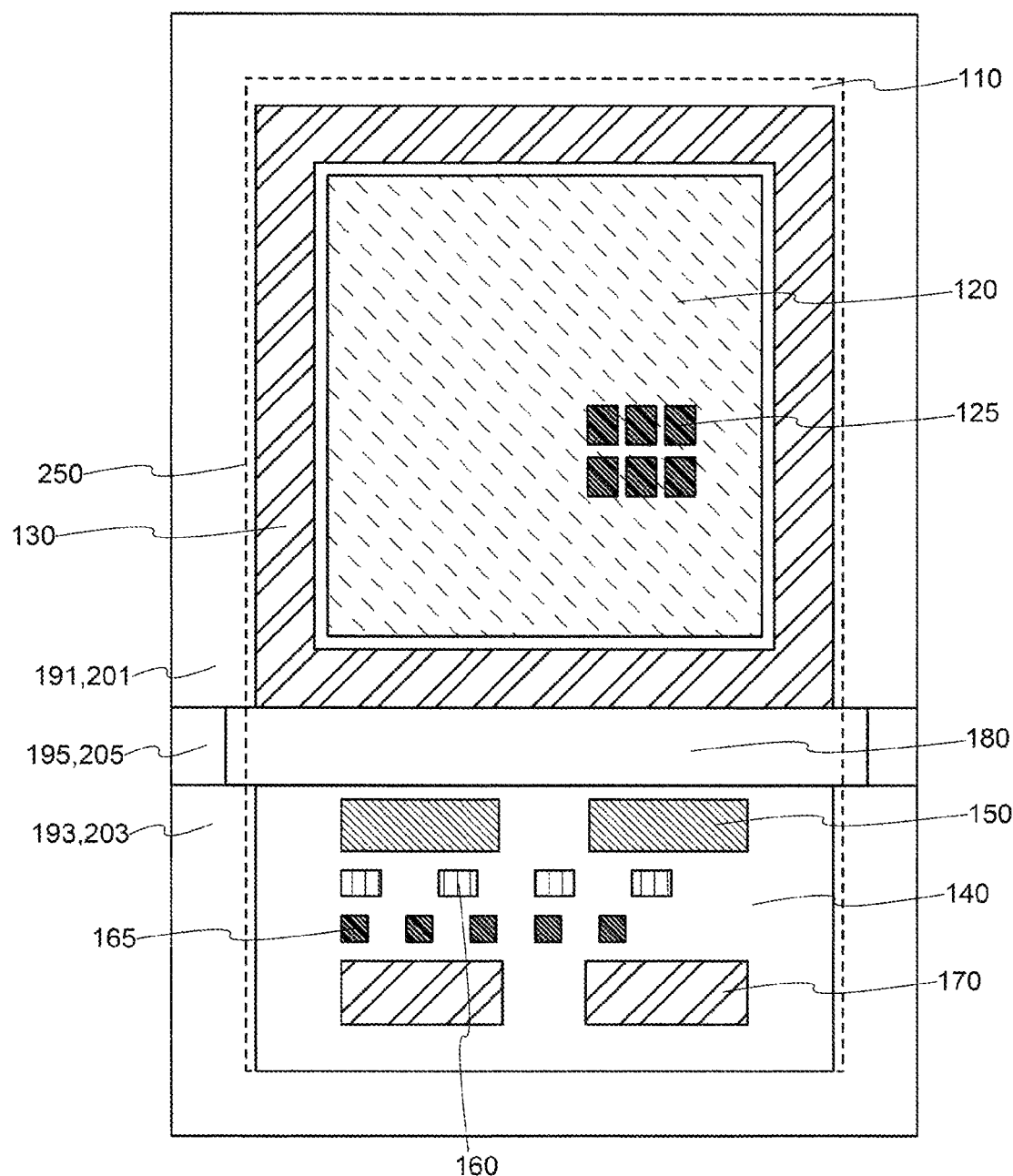
FIG. 16 is a top surface view diagram showing a manufacturing method of a display device related to one embodiment of the present invention.

For example, as is shown in FIG. 16, the substrate 110, adhesive layer 191, adhesive layer 193, adhesive layer 195, support film 201, support film 203 and support film 205 may be cut in a cutting part 250 which is on the outer side of the end parts of the frame part 130 and the mounting part 140 and is arranged on the inner side of the end parts of the adhesive layer 195 and the support film 205. By using the support film 201, the support film 203 and the support film 205, the flatness of the substrate at the time of mounting can be increased and the individual circuit elements and the connection terminal 170 can be easily mounted.

Modified Example

Although the case of an organic EL display device is exemplified as a disclosed example in the present embodiment, a liquid crystal display device, other self-light emitting display devices, or an electronic paper type display devices having electrophoretic display elements and the like, and any flat panel type display device can be given as another application example.

Although the case of a support film 203 having a higher thermal conductivity than a support film 201 (first embodiment) and the case of an adhesive layer 193 having a higher thermal conductivity than an adhesive layer 191 (second embodiment) were explained separately as a disclosed example in the present embodiment, the thermal conductivity of the support film 203 may be higher than that of the support film 201, and the thermal conductivity of the adhesive layer 193 may be higher than that of the adhesive layer 191. In this way, the individual circuit elements and the connection terminal can be further securely mounted, and the organic EL element of the display part can be protected from heat.

What is claimed is:

1. A display device comprising:
   a substrate having flexibility, and a first surface and a second surface opposing the first surface;
   a display part arranged with a plurality of pixels arranged;
   a frame part having a drive element for driving the plurality of pixels arranged around the display part;
   a mounting part including an individual circuit element mounted on the substrate and a connection element;
   a first adhesive layer arranged on the second surface of the substrate and arranged opposing the display part and the frame part;
   a first support film above the first adhesive layer;
   a second adhesive layer arranged above the second surface of the substrate and arranged opposing the mounting part; and
   a second support film above the second adhesive layer;
   a third support film located between the first support film and the second support film; and
   a fourth support film located between the first support film and the second support film,
   wherein
   the display part, the frame part, the mounting part, and a bent part are on the first surface of the substrate,
   the bent part is arranged between the frame part and the mounting part,
   the first adhesive layer and the first support film separated from the second adhesive layer and the second support film,
   the second support film has a higher thermal conductivity compared to the first support film,
   the third support film is connected to the first support film and the second support film,
   the fourth support film is connected to the first support film and the second support film, and
   the third support film and the fourth support film are disposed separately.

2. The display device according to claim 1, wherein the first support film is a resin.

3. The display device according to claim 1, wherein the second support film is a metal.

4. The display device according to claim 1, wherein the second adhesive layer has a higher thermal conductivity compared to the first adhesive layer.

5. The display device according to claim 1, wherein a heat dissipation material is included between the first adhesive layer and the first support film.

6. The display device according to claim 1, wherein the display element arranged in the display part is an organic EL element.

7. The display device according to claim 1, wherein
the third support film and the fourth support film are made of resin.

8. The display device according to claim 1, wherein
the third support film and the fourth support film are made of the same material as the material of the first support film.

9. The display device according to claim 1, wherein
the third support film and the fourth support film are located on an extension line of the frame part.

* * * * *